United States Patent
Hakey et al.

(10) Patent No.: US 6,372,412 B1
(45) Date of Patent: *Apr. 16, 2002

(54) METHOD OF PRODUCING AN INTEGRATED CIRCUIT CHIP USING FREQUENCY DOUBLING HYBRID PHOTORESIST AND APPARATUS FORMED THEREBY

(75) Inventors: Mark C. Hakey; Steven J. Holmes, both of Milton; David V. Horak, Essex Junction, all of VT (US); Ahmad D. Katnani, Poughkeepsie; Niranjan M. Patel, Wappingers Falls, both of NY (US); Paul A. Rabidoux, Winooski, VT (US)

(73) Assignee: International Business Machines Corporation, Armonk, NY (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/021,924

(22) Filed: Feb. 10, 1998

Related U.S. Application Data

(62) Division of application No. 08/715,287, filed on Sep. 16, 1996, now Pat. No. 6,114,082.

(51) Int. Cl.$^7$ .................................................. G03F 7/30
(52) U.S. Cl. ...................... 430/325; 430/326; 430/328; 430/330
(58) Field of Search ................................. 430/325, 326, 430/330, 328

(56) References Cited

U.S. PATENT DOCUMENTS

| | | | |
|---|---|---|---|
| 4,405,708 A | | 9/1983 | Van Pelt et al. .......... 430/281.1 |
| 4,568,631 A | | 2/1986 | Badami et al. ............. 430/315 |
| 4,687,730 A | | 8/1987 | Eron .......................... 430/324 |
| 4,707,218 A | | 11/1987 | Giammarco et al. ........ 438/421 |
| 4,889,789 A | * | 12/1989 | Stahlhofen .................. 430/191 |
| 5,070,001 A | * | 12/1991 | Stahlhofen ............... 430/281.1 |
| 5,210,000 A | * | 5/1993 | Thackeray et al. ......... 430/165 |
| 5,296,332 A | * | 3/1994 | Sachdev et al. .......... 430/270.1 |
| 5,330,879 A | | 7/1994 | Dennison .................... 430/313 |
| 5,629,135 A | | 5/1997 | Kobayashi et al. ...... 430/270.1 |

FOREIGN PATENT DOCUMENTS

JP    05-297597    11/1993

* cited by examiner

Primary Examiner—John S. Chu
(74) Attorney, Agent, or Firm—Schmeiser, Olsen & Watts; Mark F. Chadurajian

(57) ABSTRACT

A photoresist composition is disclosed having both negative tone and positive tone responses, giving rise to spaces being formed in the areas of diffraction which are exposed to intermediate amounts of radiation energy. This resist material may be used to print doughnut shapes or may be subjected to a second masking step, to print lines. Additionally, larger and smaller features may be obtained using a gray-scale filter in the reticle, to create larger areas of intermediate exposure areas.

13 Claims, 18 Drawing Sheets

(2 of 18 Drawing Sheet(s) Filed in Color)

METHOD OF PRODUCING AN INTEGRATED CIRCUIT CHIP USING FREQUENCY DOUBLING HYBRID PHOTORESIST AND APPARATUS FORMED THEREBY

RELATED APPLICATIONS

This application is a division of the earlier patent application by Hakey et al. entitled "FREQUENCY DOUBLING HYBRID PHOTORESIST HAVING NEGATIVE AND POSITIVE TONE COMPONENTS AND METHOD OF PREPARING THE SAME", Ser. No. 08/715,287, filed Sep. 16, 1996, now U.S. Pat. No. 6,114,082 that is incorporated herein by reference. This application is a sister application to co-pending U.S. patent application by Holmes et al. entitled "LOW 'K' FACTOR HYBRID PHOTORESIST", Ser. No. 08/715,288, filed Sep. 16, 1996, that is likewise incorporated herein by reference.

BACKGROUND OF THE INVENTION

1. Technical Field

This invention relates generally to the manufacture of integrated circuit (IC) chips, and more specifically, to a photoresist material that includes both positive tone and negative tone attributes.

2. Background Art

Manufacturing of semiconductor devices is dependent upon the accurate replication of computer aided design (CAD) generated patterns onto the surface of a device substrate. The replication process is typically performed using lithographic processes followed by a variety of subtractive (etch) and additive (deposition) processes.

Photolithography, a type of lithographic process, is used in the manufacturing of semiconductor devices, integrated optics, and photomasks. The process basically comprises: applying a layer of a material that will react when exposed to light, known as a photoresist or, simply, a resist; selectively exposing portions of the photoresist to light or other ionizing radiation, i.e., ultraviolet, electron beams, X-rays, etc., thereby changing the solubility of portions of the material; and developing the resist by washing it with a basic developer solution, such as tetramethylammonium hydroxide (TMAH), thereby removing the non-irradiated (in a negative resist) or irradiated (in a positive resist) portions of the layer.

Conventional positive and negative tone photoresists are characterized by a dissolution curve in which there is a single transition from a first dissolution rate to a second dissolution rate as the resist is exposed to varying levels of actinic radiation. In a positive resist, the initially unexposed resist is insoluble in developer, while the exposed resist becomes more soluble as the exposure dose is increased above a threshold value. For a negative resist, similar behavior is observed, except that the initially unexposed resist is soluble in developer, and the exposed area is rendered insoluble. By means of this differential solubility between the exposed and unexposed resist areas, it is possible to form a pattern in the resist film. This pattern can be used to form integrated circuit devices, and is currently a critical component in their manufacture.

In an ideal situation, the exposure tool would only allow the radiation to hit the resist material in the areas of the mask that are clear, thus providing sharp edges for the lines and spaces. However, diffraction patterns are formed at the edges of the clear areas, resulting in partial exposure of the resist in those areas. Certain patents have taken advantage of this phenomenon, such as U.S. Pat. No. 4,568,631 issued to Badami et al. on Feb. 4, 1986 and assigned to the assignee of record for the present invention, which discloses utilizing a positive resist and an additive for image reversal in order to create thin resist lines only in the areas where light intensity has been reduced by diffraction effects. However, this procedure uses a resist with conventional positive and negative tone dissolution responses and requires two separate expose and develop operations to form a resist image from the edge of a reticle image.

As the need for higher and higher levels of integration has arisen in the industry, the need for a larger number of lines and spaces in a given area has increased dramatically. In response, a primary subject of research has been enhancement of the exposure tool and reticle system to enhance the aerial image of the circuit pattern. For example, phase shift reticles, shorter wavelength expose tools, higher numerical aperture expose tools, and tools with selective illumination systems are continuing to be developed to improve the pattern density of integrated circuits. Due to the high cost, poor yield, and difficulty of inspection and repair, phase shift reticles are generally not available for use. Due to the complexity of exposure tool design and construction, it is very expensive to build higher numerical aperture and shorter wavelength expose systems.

In another area of activity, efforts are being made to improve the contrast of the photoresist. However, the basic mechanism of operation of the photoresist continues to be the same; that is, the resists behave as either positive or negative tone systems. It is desirable, therefore, to devise new a mechanisms of resist response such that conventional optical lithography can be extended to smaller feature sizes without developing new tools and reticles. Additionally, as these new tools and reticles are eventually developed and implemented, these new resist approaches would remain applicable as a further extension of lithographic capability.

Presently, for high performance devices, the control of the image size on the reticle and the control of image size from one batch of wafers to the next comprise the largest contributors to image size variation on the product. Chip yield at high performance is strongly dependent on the uniformity of the image pattern across the chip and the centering of the image pattern at the correct dimension. These limitations exist currently for all types of lithographic patterning which use a reticle; optical, x-ray, and proximity E-beam, for example The problem of image uniformity across the reticle is especially acute for lithographic techniques that use 1× masks, such as x-ray and proximity E-beam lithography. It is therefore desired to provide a photoresist material that allows very precise image control for the image size, independent of the image size control on the reticle.

SUMMARY OF THE INVENTION

Accordingly, the present invention provides a photoresist material having, simultaneously, both a positive tone and a negative tone response to exposure. This combination of materials can provide a new type of resist, which we call a hybrid resist.

As a hybrid resist is exposed with actinic radiation, areas exposed with high intensity radiation form a negative tone line image. Areas which are unexposed remain insoluble in developer, thus forming a positive tone line pattern. Areas which are exposed with intermediate amounts of intensity, such as the edges of the aerial image where diffraction effects have reduced the intensity, form a space in the resist film during develop. This resist response is an expression of the unique dissolution rate properties of this resist, in which unexposed resist does not develop, partially exposed resist develops at a high rate, and highly exposed resist does not develop.

It is, therefore, a feature of the present invention that the unique dissolution rate response of the hybrid photoresist allows a single aerial image to be printed as a space/line/space combination rather than as a single line or space, as with conventional resist. This 'frequency doubling' capability of this resist allows conventional expose systems to be extended to higher pattern densities. It is an advantage of one example of the present invention that lines and spaces of 0.2 $\mu$m and less can be printed with current deep ultra violet (DUV) lithography tools that are designed for operation at 0.35 $\mu$m resolution.

It is a further advantage of this type of hybrid resist that the space width is generally unchanging as the exposure dose and the reticle image size are changed. This allows very precise image control for the space width within each chip, across each wafer, and from one batch of product wafers to the next.

Still another advantage of this invention is the relaxation of the minimum reticle feature size due to the frequency doubling capability of hybrid resist. For example, to print a 0.2 $\mu$m feature with conventional resist generally requires a 0.2 $\mu$m reticle image size. With hybrid resist, a 0.2 $\mu$m space can be formed with a single edge of a reticle feature; for example, a 0.5 $\mu$m reticle opening could produce two 0.2 $\mu$m spaces and a 0.2 $\mu$m line. In this way, one could accomplish 'reduction' x-ray or E-beam lithography; the reticle image pitch could be approximately 2× the printed pitch on the substrate. This also has the additional advantage of allowing a relaxation of the image size requirements of optical reticles, reducing cost and improving yield of the reticle.

It is an advantage of the present invention that lines and spaces of 0.2 $\mu$m and less may be achieved without altering the present tools.

It is a further advantage that the space width is generally unchanging as the exposure dose and reticle sizes change, thereby allowing greater process latitude for control of space width. Through the use of the hybrid resist of the present invention, errors in the image dimension on the reticle are not reproduced in the space width printed on the substrate. As a result, the across-chip space width variation is minimized. This is valuable for optical, X-ray and e-beam exposure methods. It is especially useful in lithographic techniques that require a 1× reticle, i.e., a reticle that normally has a one-to-one relationship with the image printed on the substrate, because variations in the image size on the reticle are normally reproduced on the substrate.

The foregoing and other features and advantages of the invention will be apparent from the following more particular description of preferred embodiments of the invention.

BRIEF DESCRIPTION OF THE DRAWINGS

The file of this patent contains at least one drawing executed in color. Copies of this patent with color drawings will be provided by the Patent and Trademark Office upon request and payment of the necessary fee.

The preferred exemplary embodiment of the present invention will hereinafter be described in conjunction with the appended drawings, where like designations denote like elements, and.

DETAILED DESCRIPTION OF THE PREFERRED EMBODIMENTS

Figure 16:
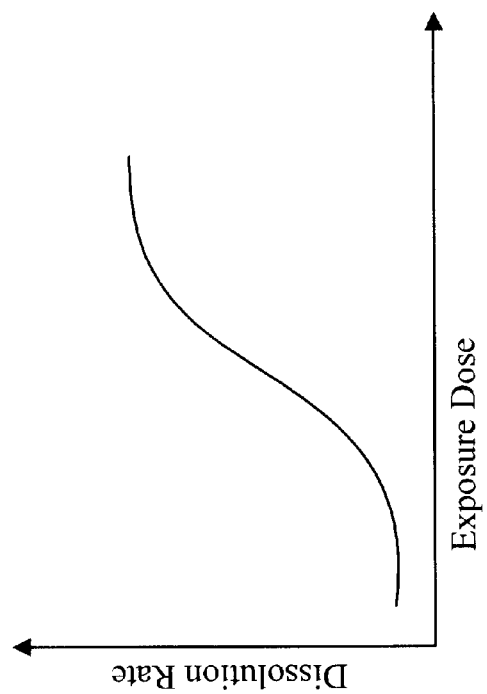

Accordingly, the present invention provides a photoresist material having, simultaneously, both a positive tone and a negative tone response to exposure. The positive tone response dominates at the lower exposure dose while the negative response predominates at the higher exposure dosages. Exposure of this resist creates a spaceline/space combination, whereas either of the conventional resists would produce only a single feature. Turning to FIG. 16, a graph is illustrated showing how the positive resist undergoes an increase in solubility as the exposure dose is increased.

Figure 17:
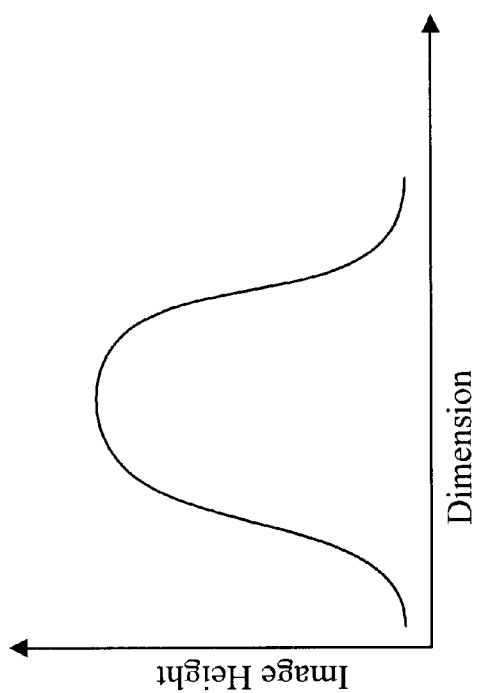
Figure 18:
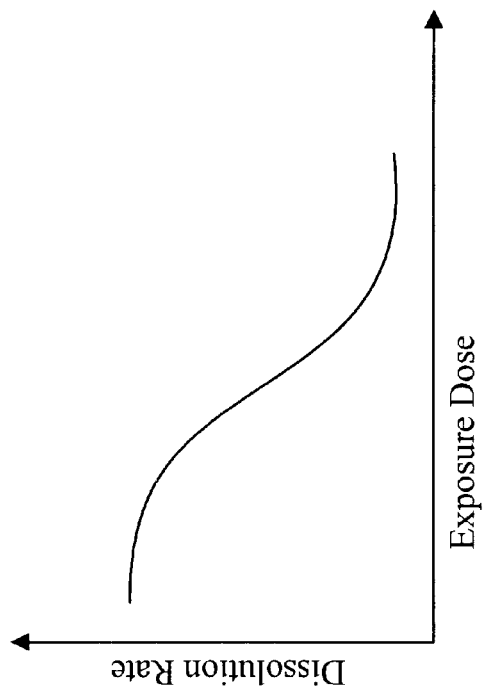

Turning to FIG. 17, the line pattern for positive resist printed. On the other hand, in the negative resist system exposed areas undergo a reduction in solubility as the exposure dose is increased as illustrated in FIG. 18.

Figure 1:
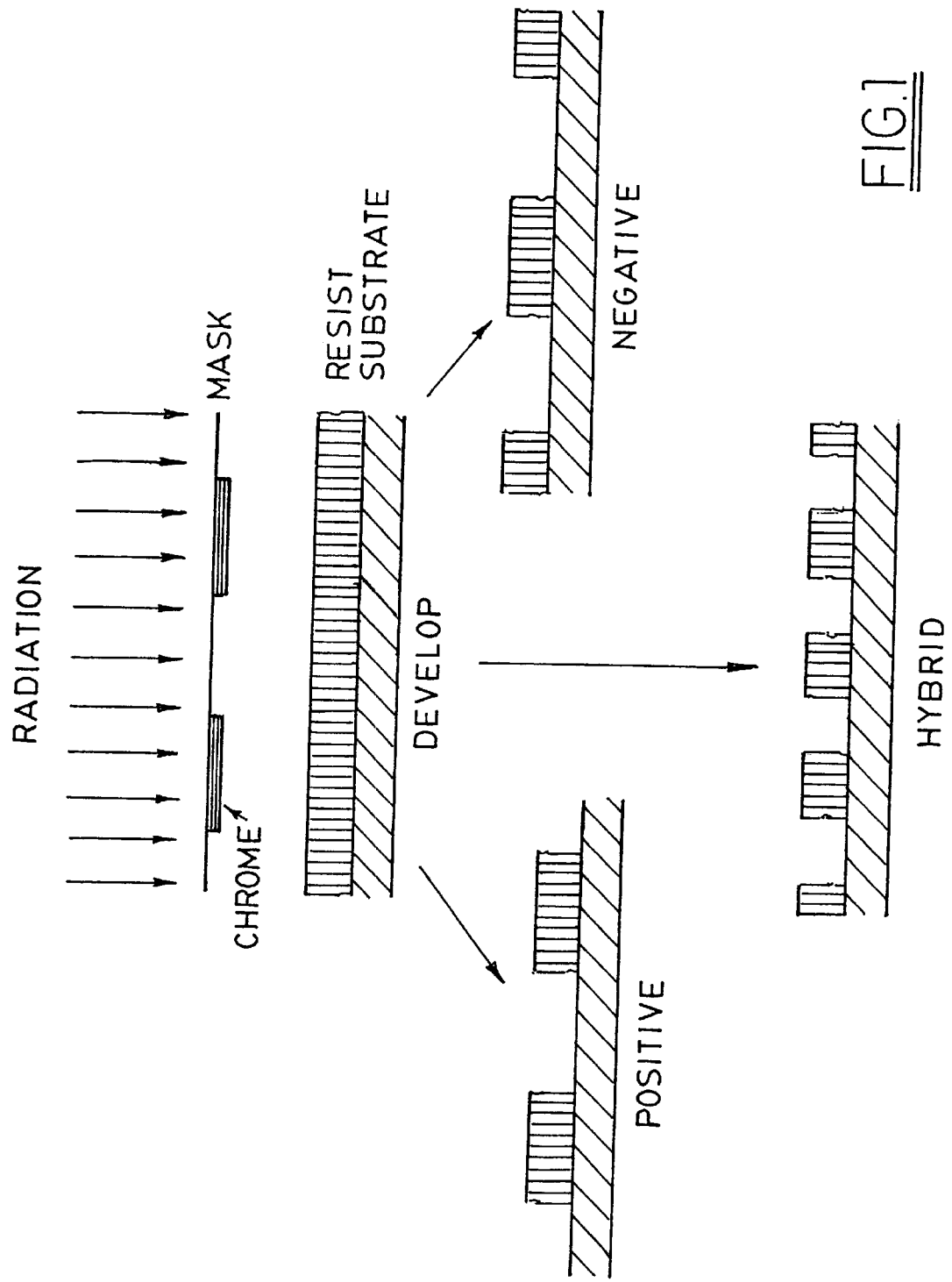
FIG. 1 is a schematic of the use of the present invention.
Figure 19:
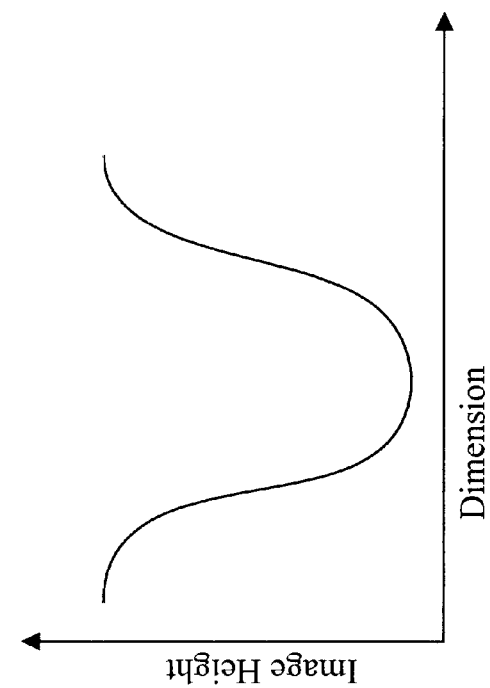
Figure 21:
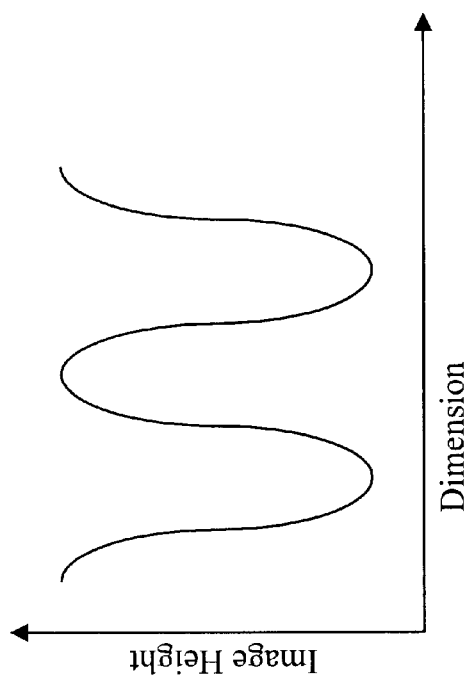
Figure 20:
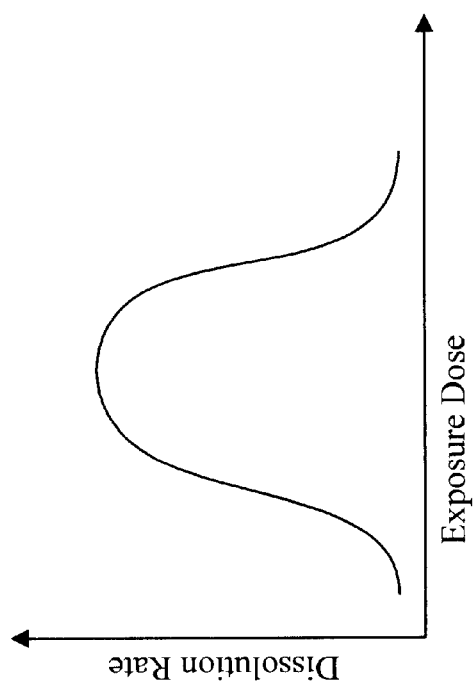

Turning to FIG. 19, the line pattern for negative resist printed with a reticle line pattern is illustrated. For the hybrid resist of the present invention, the positive tone response causes an increase in solubility in the areas where diffraction effects have reduced the expose intensity, such as the areas near the edge of the reticle image. As the exposure dose is increased, the negative tone response predominates, causing a reduction in solubility in the more highly exposed areas. Turning to FIG 20, the graph of the resist solubility as a function of exposure dose for hybrid resist is illustrated. Printing a reticle line pattern onto a substrate results in the space/line/space pattern illustrated in FIG. 21. In this manner, the aerial image is "frequency doubled" to produce twice the number of features than would otherwise be attainable with the standard resist. FIG. 1 illustrates these salient differences between a positive resist, a negative resist, and a hybrid resist.

The frequency doubling hybrid resist is typically formulated using components of existing positive and negative tone resists. This includes, for example, poly (hydroxystyrene) resins which are partially modified with acid-sensitive solubility dissolution inhibiting functionalities, a cross-linker, a photo-acid generator, and, optionally, a base additive and a photosensitizer.

Figure 4:
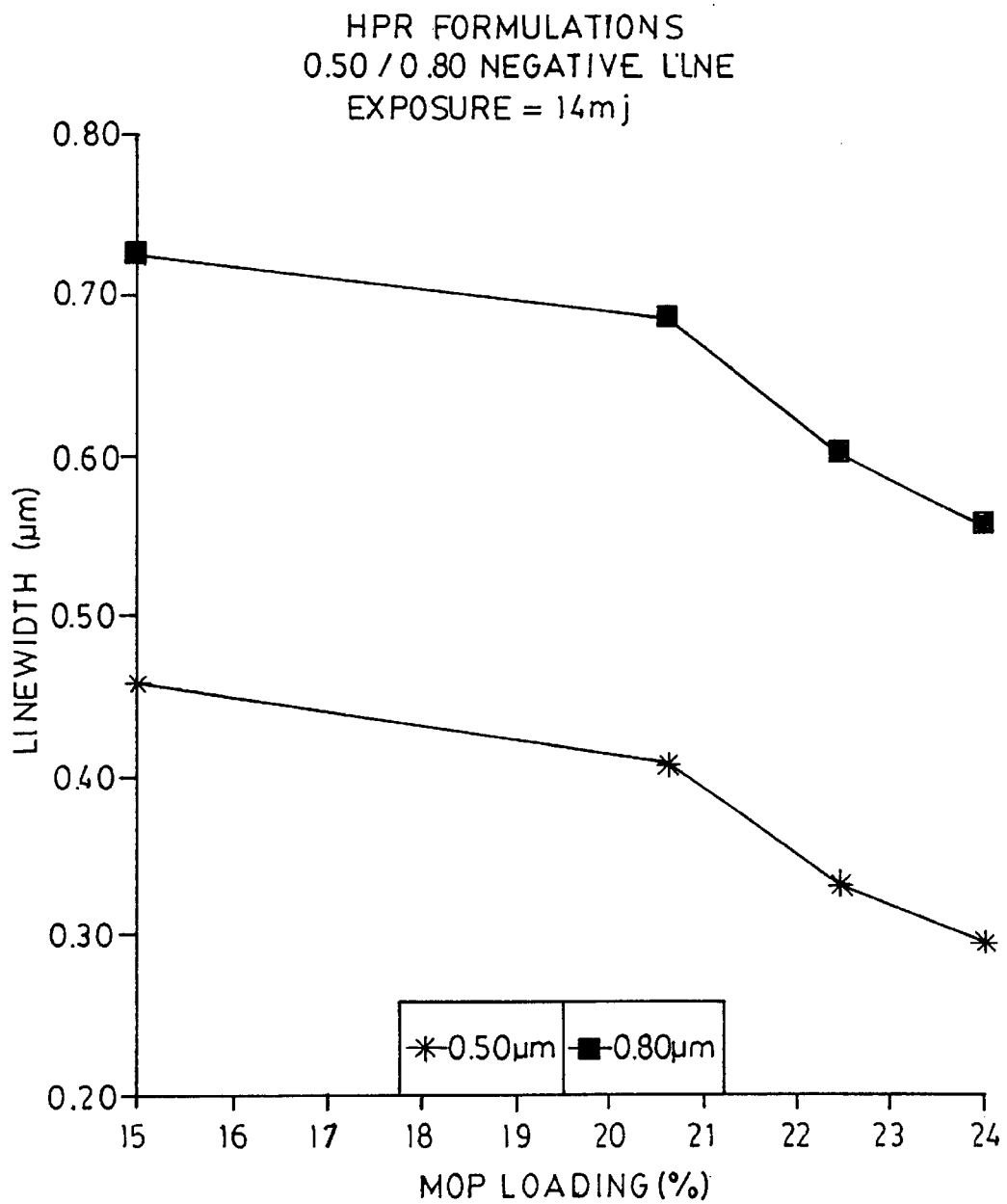
FIG. 4 is a graph showing the linewidth in nm plotted against the amount of positive tone solubility inhibitor (MOP) incorporated in a hybrid resist of the present invention.
Figure 13:
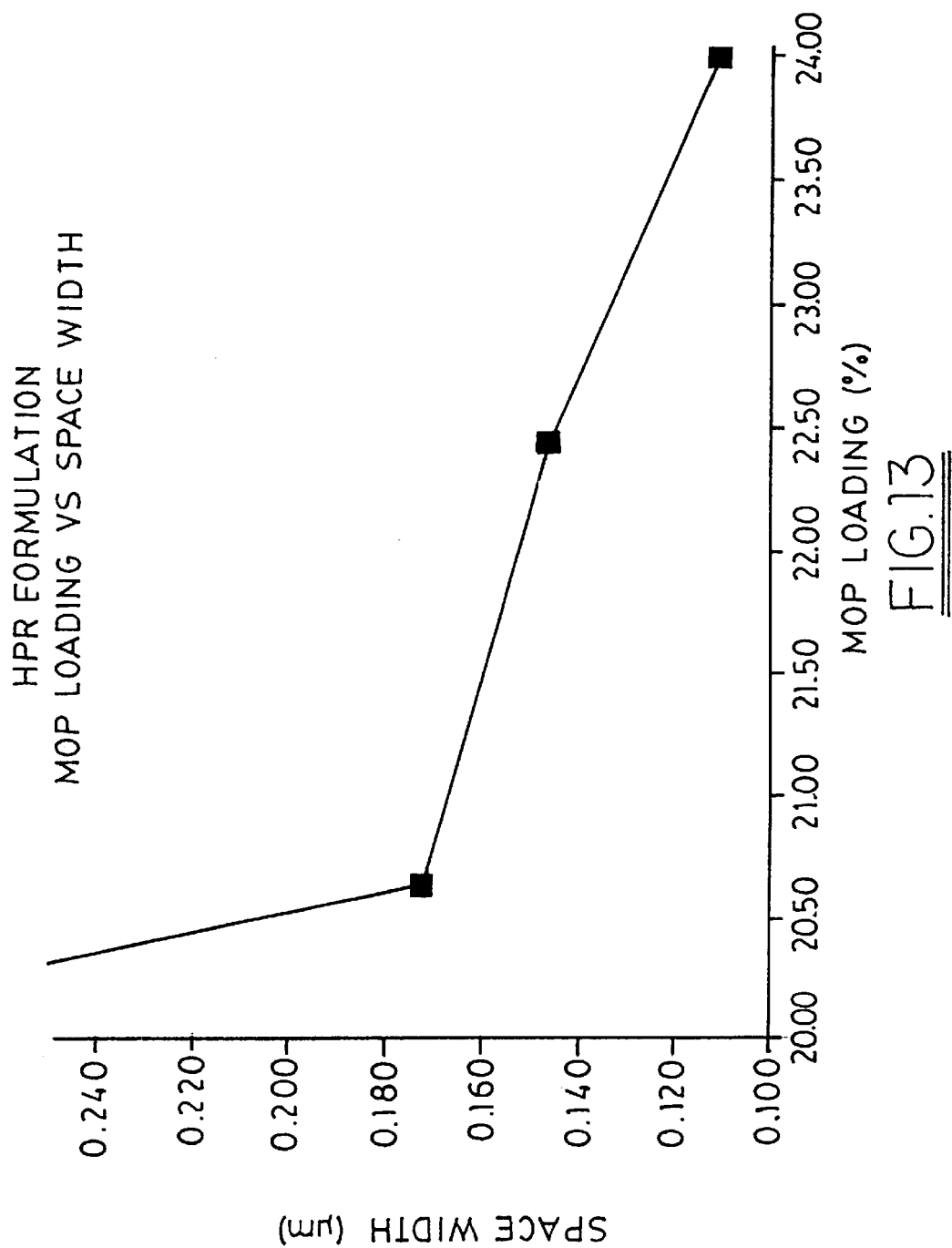
FIG. 13 is a graph showing the variation in space width in $\mu$m as a function of MOP loading using one formulation of hybrid resist of the present invention.

The resist formulations may be varied to obtain a fast positive tone reaction and a slow negative tone reaction for optimal results. Additionally, the positive tone component can be chosen such that it is relatively insensitive to post expose bake temperatures, while the negative tone portion is chosen to be more highly sensitive to post expose bake temperatures. In this way, the relative sensitivity of the positive and negative responses can be altered with bake temperatures to provide the desired imaging results In addition, the resist formulations may be altered to provide space widths of different dimensions. For example, as the amount of solubility inhibitor on the poly (hydroxystyrene) resin is increased, the printed space width becomes smaller (FIG. 13). This approach may also be used to alter the isofocal print bias of the negative tone line; at higher positive tone solubility inhibitor concentrations, the isofocal print bias of the negative tone line increases (FIG. 4). This is desirable in some applications for reducing the size of the printed negative tone line, optimizing the frequency doubling characteristics of the resist.

The relative responses of the positive and negative tone functions of the hybrid resist can also be altered by modifying the exposure conditions. For example, the negative tone line of the hybrid resist does vary with exposure dose and reticle dimension, similar to the behavior of a conventional resist. Thus, as exposure dose is increased, for example, the negative tone line increases in width, and the spaces remain the same size, but the spaces are shifted to a new position on the substrate, since they lie adjacent to the negative line. Similarly, the positive tone lines alter in size as the exposure dose or reticle dimension are altered.

As another example, two reticles could be used to print two separate patterns in the resist. One reticle could be exposed with a high dose, causing the hybrid functions to be expressed in the resist. Another reticle could be exposed in the same resist film at a lower dose, causing only the positive tone function to be expressed in that portion of the resist. This effect could also be accomplished with a single expose process if, for example, the reticle contained a partial filter of the actinic radiation in the areas where a lower exposure dose was desired. This allows wider spaces to be printed at the same time as the narrower features, which is necessary in some device applications.

In a modification of this two-step imaging approach, a hybrid resist can be used to create a standard negative tone pattern. If the resist film is image-wise exposed with a standard negative tone reticle, baked to form the hybrid image, then blanket exposed with actinic radiation and developed without a second post-expose bake process, the result is a standard negative tone image. This approach may be desirable in some applications, such as the formation of gate conductor circuits, which require very small lines to be printed, but do not require a high density image pitch. As an alternative to this method, the resist may be blanket exposed to a low dose of actinic energy after the image-wise exposure and before the baking step. The desirability of the method would depend on whether a solubility inhibiting protective group is present on the resin and whether the positive tone response is temperature dependent.

Figure 2:
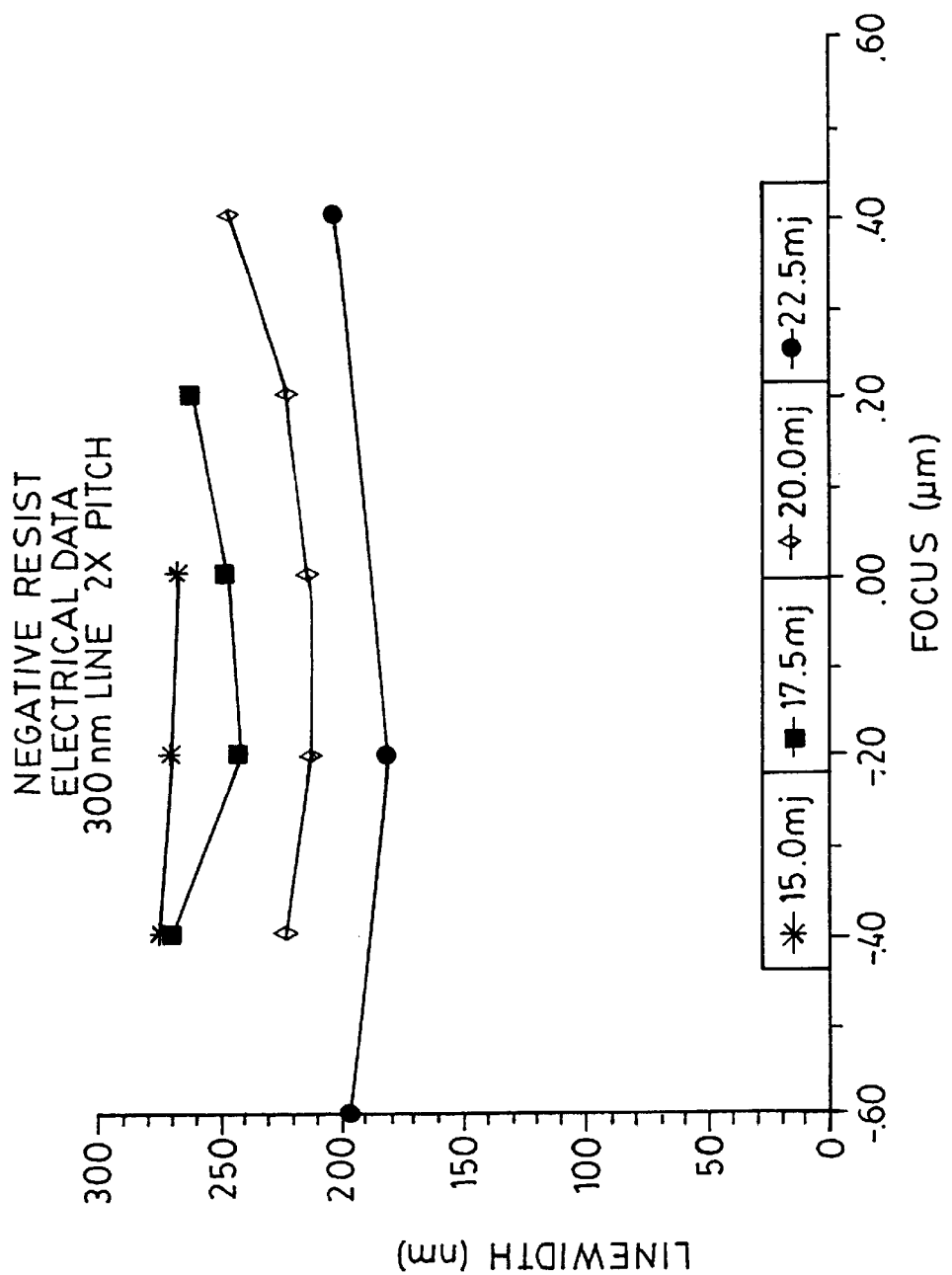
FIG. 2 is a graph of linewidth in nanometers (nm) plotted against focus in microns ($\mu$m) of a formulation of a standard negative resist at various exposure energies.
Figure 3:
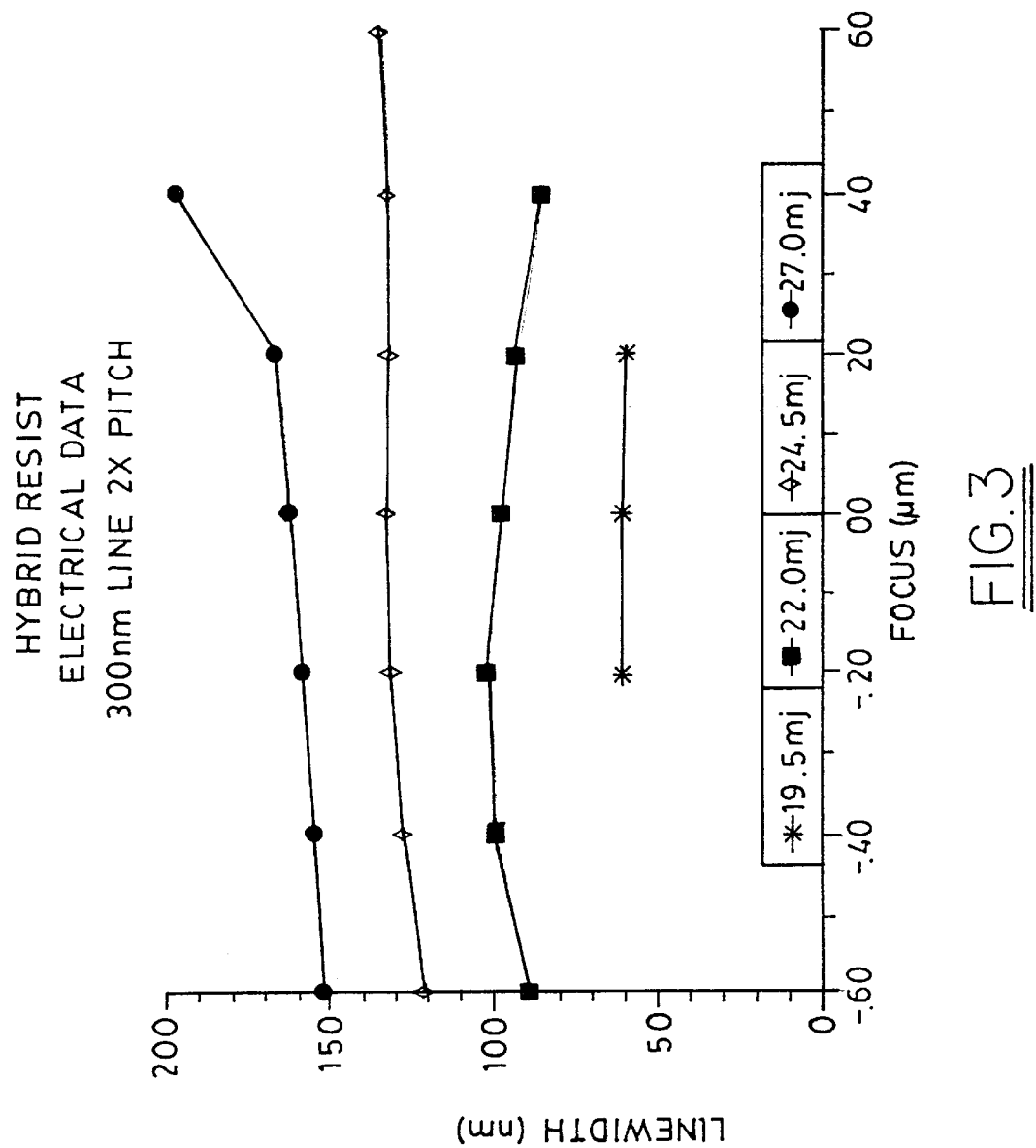
FIG. 3 is a graph of linewidth for a negative tone line of a hybrid pattern in nm plotted against focus in $\mu$m of a hybrid resist of the present invention at various exposure energies.

An advantage of using the hybrid resist in such application is that the negative tone line of the hybrid resist can exhibit a large print bias at its isofocal point, as shown in FIG. 3. In other words, at the point of largest process latitude for the hybrid negative tone line, the resist image size can be substantially smaller than the reticle image size. This is desirable because the aerial image is less degraded by diffraction effects at the larger reticle size, thus allowing a larger depth of focus to be attained than is possible with conventional positive and negative tone systems, as shown in FIG. 2. This print bias is a result of the fact that the edge of the chrome line prints as a space. The space, in effect, acts to 'trim' the edges of the aerial image, causing the negative line to print smaller than it would with a conventional negative resist. This is an expression of the frequency doubling character of a hybrid resist.

It is possible to design the resist formulation to optimize the print bias of the negative tone line. For example, by choosing an appropriate loading factor for the positive tone solubility inhibitor, one may obtain a particular print bias as shown in FIG. 4. In theory, it is quite obvious that similar variations in the photoresist response can also be brought about by making appropriate changes in concentrations and reactivities of other components as well.

Figure 5:
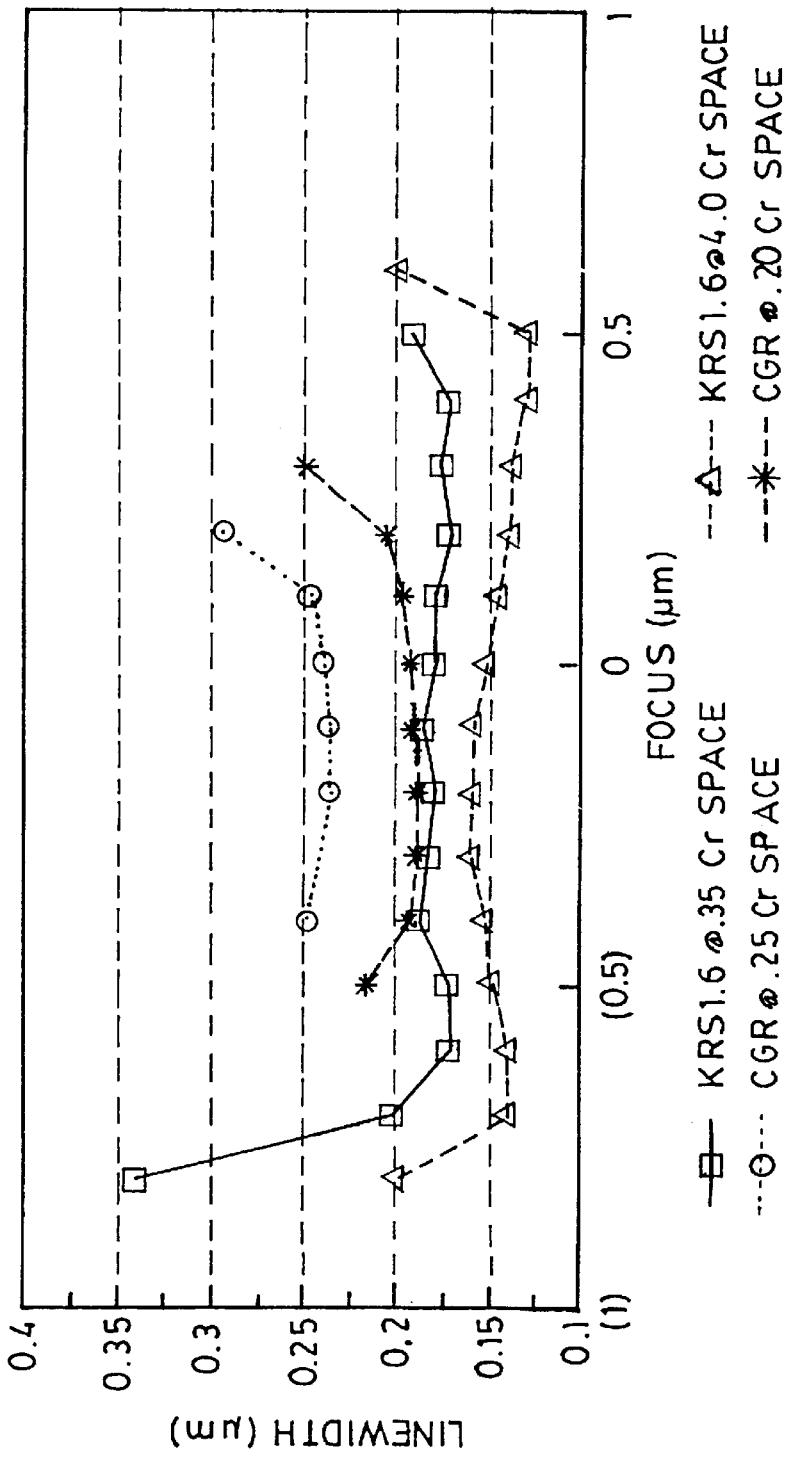
FIG. 5 is a comparative model of what the range of focus is for a given linewidth using standard resist formulations and a hybrid resist formulation of the present invention.

For example, we have found that with exposure on a DUV 0.5 NA lithography tool, the isofocal print bias for a hybrid resist can be 0.11 $\mu$m larger than the isofocal print bias for a standard negative tone resist, as exemplified in FIGS. 2 and 3 when standard calculations known in the art are performed on the data. This difference can be utilized in two ways. In one approach, the same reticle image size could be used with the hybrid resist to print a smaller line than the standard resist, while maintaining focus and exposure process latitude. In another manner of use, the size of the reticle features could be increased with the hybrid resist relative to the standard resist, while printing the same image size as the standard resist. The use of a larger reticle image provides a larger depth of focus due to reduced diffraction effects, as shown in the graph of FIG. 5. In the former application, higher performance is achieved with the smaller size of the hybrid resist. In the latter application, higher yield is achieved due to the larger process latitude of the hybrid resist.

The resist formulations may be varied to obtain a high photospeed positive tone reaction and a low photospeed negative tone reaction for optimal results. Additionally, the positive tone resist may be chosen so that it is insensitive to post expose bake (PEB) conditions so that the ratio of sensitivity of the positive tone to the negative tone function can be altered, thus changing the ratios of the space/line/space combinations.

Another option for changing the space/line/space ratios is to utilize a gray-scale filter in the reticle of the exposure tool. A gray scale filter only allows a portion of the radiation to pass through the reticle, thereby creating areas of intermediate exposure. This prevents the negative tone resist function from operating in these areas because the exposure dose would never reach the critical point, but would still allow the positive functions to occur, thereby creating wider spaces. This allows wider spaces to be printed at the same time as the narrower features, which is necessary in some device applications.

Figure 6:
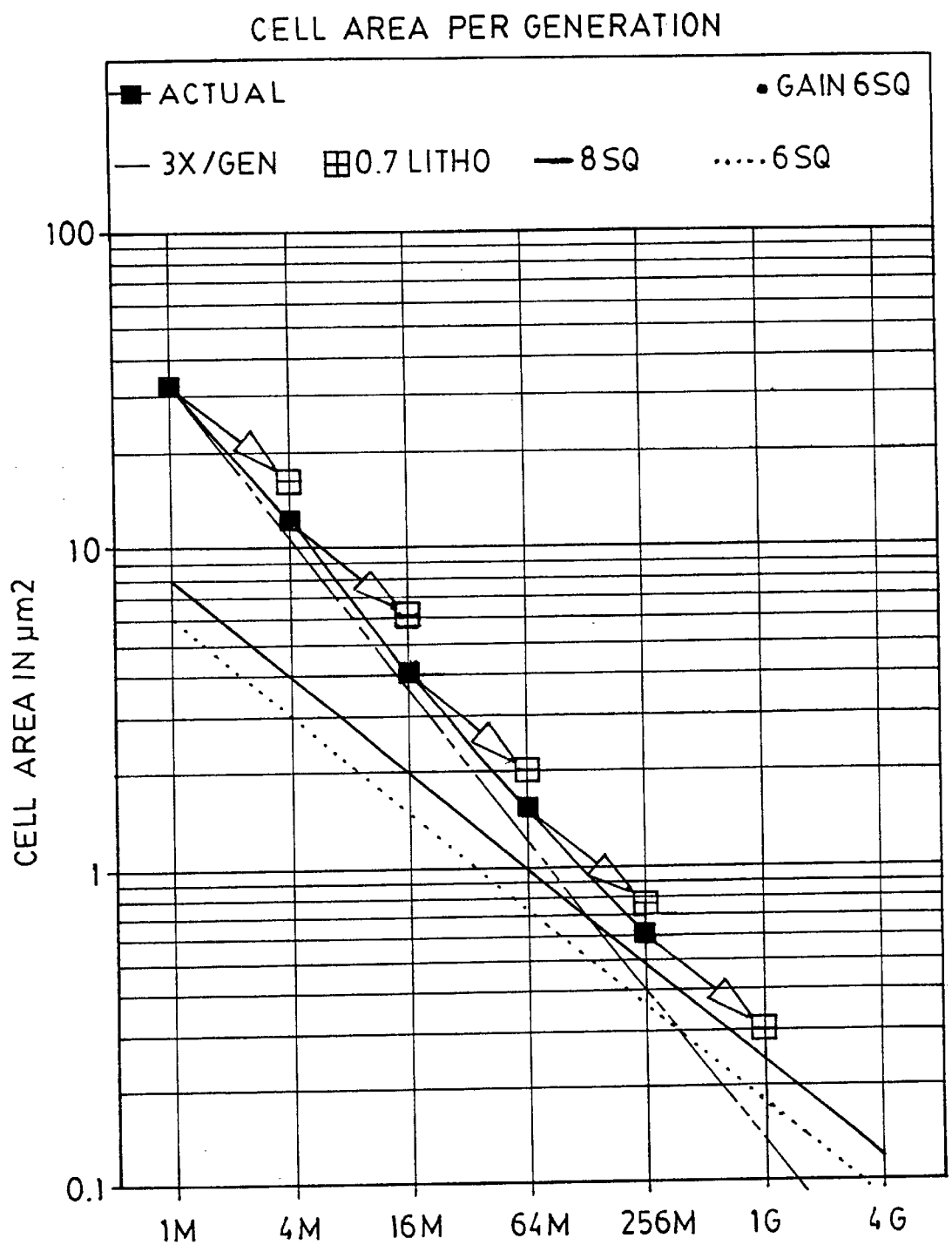
FIG. 6 is a graph showing the relationship between the cell area and the generation of the device.

In a further processing refinement, the doughnut shaped features that are typically obtained can be trimmed with a second masking step if they are not desired. Although circular or oblong doughnut-shaped trenches are desirable in deep trench capacitors in dynamic random access memory (DRAM) and first level wiring of the 1 gigabyte(GB) DRAM, lines are necessary for the four square (4 SQ) and six square (6 SQ) wiring of bitlines and wordlines. As shown in FIG. 6, the trends in cell area per generation show that the typical eight square (8 SQ) line is not going to meet the area requirements for the 1 GB and higher density devices. For this reason, changes in device layout, such as staggered bitlines, have been suggested. However, with the reliable, sub-lithographic features, as disclosed in the present invention, the folded bitline architecture of the chip would still be possible. Additionally, should further advances be made in the device layout, the ability to reduce the feature size may enhance the device's overall performance and size.

Figure 7:
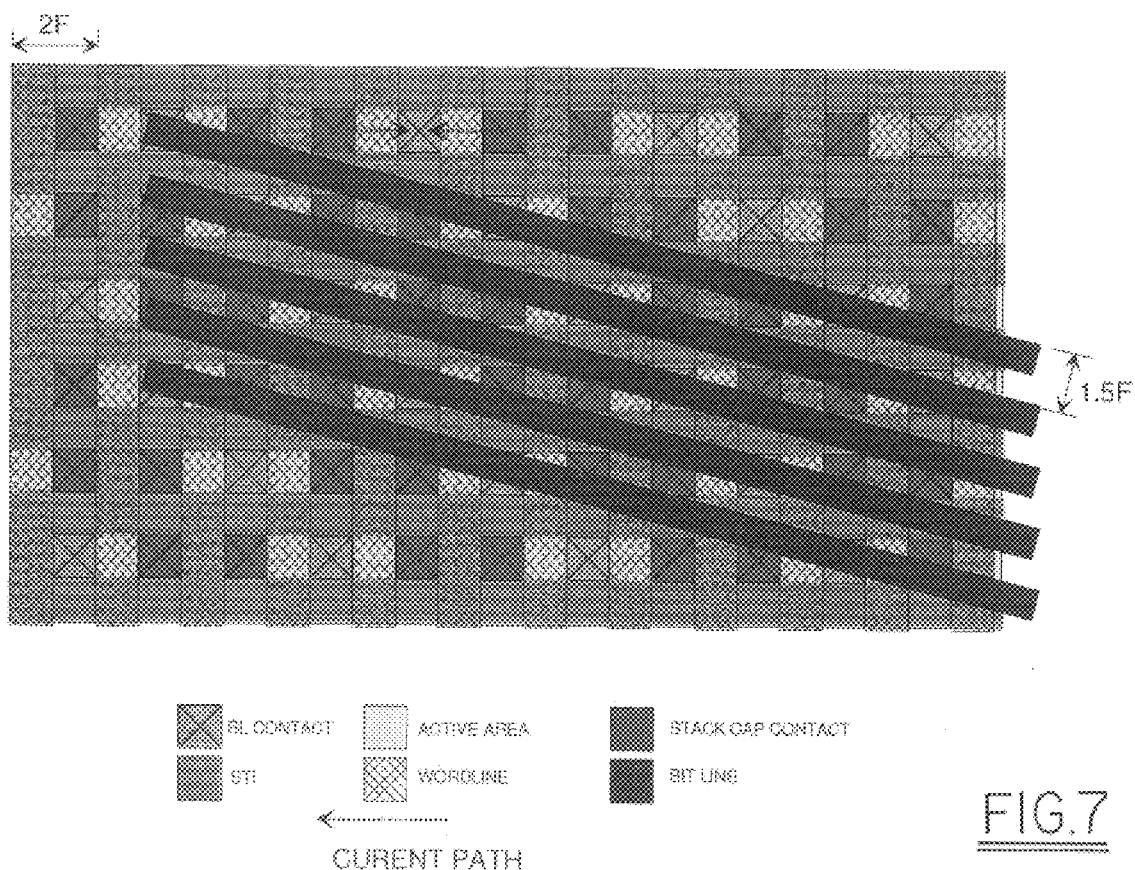
FIG. 7 is a color schematic showing a sample layout for a six square cell in which a hybrid resist of the present invention may be used to form the bitline.
Figure 8:
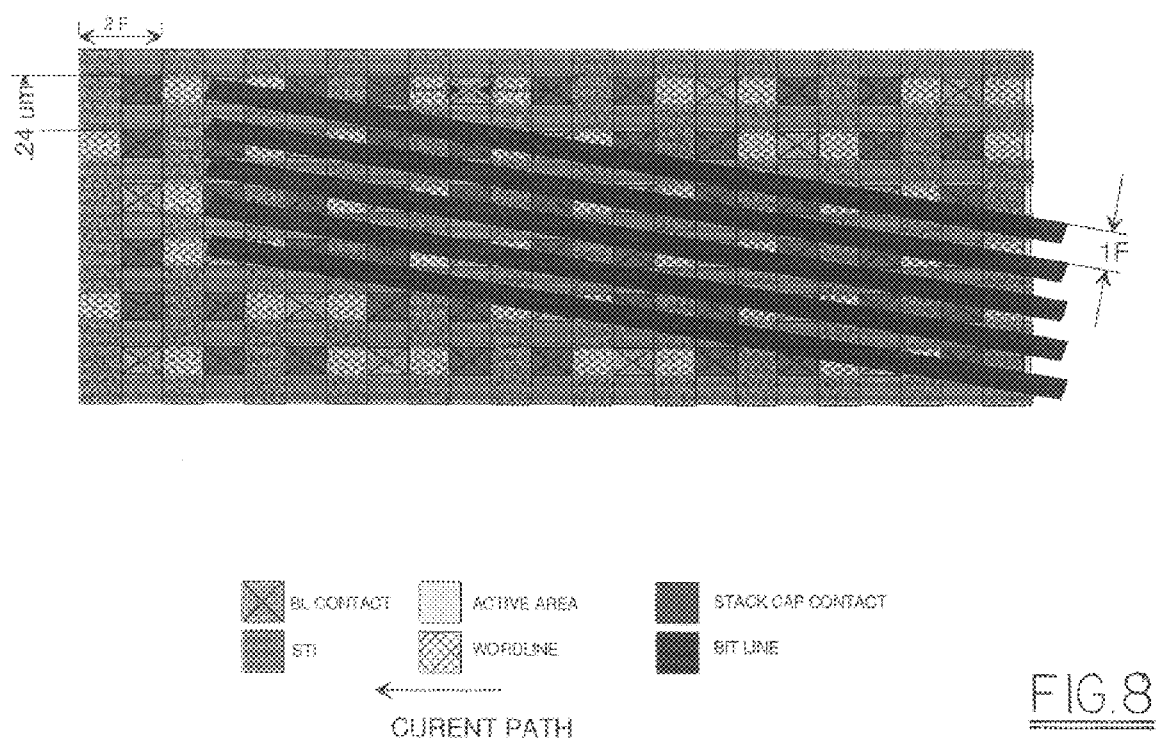
FIG. 8 is a color schematic showing a sample layout for a four square cell in which a hybrid resist of the present invention may be used to form the device.

As shown in FIG 7, a 6 SQ stacked capacitor folded bitline architecture is provided in which the pitch of the bitline is 1.5 F, as is required in order to make the appropriate connections. By reducing the pitch of the bitlines even further to 1.0 F and reducing the width of the shallow trench isolation (STI) level in the vertical direction, a 4 SQ stacked capacitor folded bitline architecture is attainable with the current technology as shown in FIG. 8. For the 4 SQ, the stacked capacitors in the y-direction will also have to be defined using the hybrid resist of the present invention.

The following examples are exemplary of the frequency doubling resist composition, but are not meant to be limiting and many variations will be readily apparent to one of ordinary skill in the art.

The photoresist resins suitable for use in accordance with the invention include any of the base-soluble, long chain polymers suitable for use as a polymer resin in a photoresist formulation. Specific examples include: (i) aromatic polymers having an -OH group, e.g., polyhydroxystyrenes such as poly (4-hydroxystyrene), poly (3-hydroxystyrene), commercially available from Hoechst Celanese of Corpus Christi, Tex., novolak resins commercially available from Shipley of Marlboro, Mass., and polymers having a phenolic —OH group, e.g., phenol formaldehyde resins; (ii) polymers having an acid group, e.g., polymethacrylic acid with an ester side chain; and (iii) acrylamide group type polymers.

The polymer resin in its deprotected form, i.e., once the positive tone reaction has occurred is base base soluble and compatible with developer solutions, such as aqueous solutions of metal-free ammonium hydroxide, tetramethylammonium hydroxide, and tetraethyl ammonium hydroxide, metal containing potassium hydroxide, and sodium metasilicate. Preferred polymer resins have an average molecular weight within the range of about 1,000 daltons to about 250,000 daltons, and most preferably within the range of about 1,000 to 25,000 daltons, to enhance its solubility in developer solutions. Examples include p-hydroxystyrene- maleic acid anhydride copolymers, polyhydroxystyrene-p-tertiarybutyl-carganatostyrene co-polymers, poly(2-hydroxystyrene), phenolformaldehyde resins, polymethyl methacrylate- tertiary butyl methacrylate-polymethacrylic acid terpolymers, poly-4-hydroxystyrene-tertiary butyl methacrylate copolymers, poly(4-hydroxystyrene) with one or more acid labile alkyl or aryl substituents on the aromatic ring, a poly(3-hydroxystyrene) with one or more alkyl or aryl substituents on the aromatic ring, or any of these as the major number of subunits in a copolymer, such as PHM-C, commercially available from Maruzen America of New York, N.Y. The PHM-C includes both poly (hydroxystyrene) subunits and vinyl cyclohexanol subunits preferably being in the range of about 99:1 to about 50:50. The most preferred ratio is about 90 poly (hydroxystyrene) units to about 10 vinyl cyclohexanol subunits.

Crosslinking compositions are preferably tetramethoxymethyl glycouril ("Powderlink") and 2,6-bis(hydroxymethyl)-p-cresol. However, other possible crosslinking compositions include:

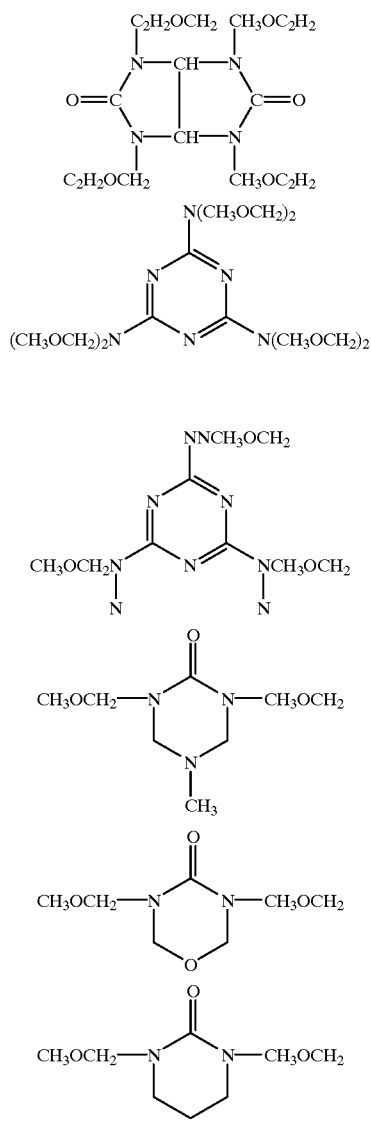

their analogs and derivatives, as can be found in Japanese Laid-Open Patent Application (Kokai) No. 1-293339, as well as etherified amino resins, for example methylated or butylated melamine resins (N-methoxymethyl- or N-butoxymethyl-melamine respectively) or methylated/butylated glycol-urils, for example of the formula:

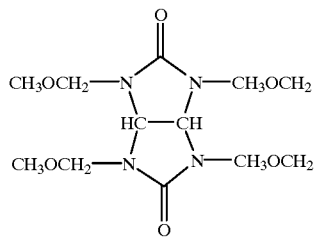

as can be found in Canadian Patent No. 1 204 547.

Photoacid generators ("PAG") include, but are not limited to: N-(trifluoromethylsulfonyloxy)-bicyclo[2.2.1]hept-5-ene-2,3-dicarboximide ("MDT"), onium salts, aromatic diazonium salts, sulfonium salts, diaryliodonium salts and sulfonic acid esters of N-hydroxyamides or -imides, as disclosed in U.S. Pat. No. 4,731,605, incorporated herein by reference. Also, a PAG that produces a weaker acid such as dodecane sulfonate of N-hydroxy-naphthalimide ("DDSN") may be used.

Possible base additives include, but are not limited to: dimethylamino pyridine, 7-diethylamino-4-methyl coumarin ("Coumarin 1"), tertiary amines, proton sponge, berberine, and the polymeric amines as in the "Pluronic" or "Tetronic" series from BASF. Additionally, tetra alkyl ammonium hydroxides or cetyltrimethyl ammonium hydroxide, may be used when the PAG is an onium salt.

Examples of sensitizers that may be utilized include: chrysenes, pyrenes, fluoranthenes, anthrones, benzophenones, thioxanthones, and anthracenes, such as 9-anthracene methanol (9-AM). Additional anthracene derivative sensitizers are disclosed in U.S. Pat. No. 4,371,605, which is incorporated herein by reference. The sensitizer may include oxygen or sulfur. The preferred sensitizers will be nitrogen free, because the presence of nitrogen, e.g., an amine or phenothiazine group, tends to sequester the free acid generated during the exposure process and the formulation will lose photosensitivity.

The casting solvent is used to provide proper consistency to the entire composition so that it may be applied to the substrate surface without the layer being too thick or too thin. Sample casting solvents include: ethoxyethylpropionate ("EEP"), a combination of EEP and γ-butyrolactone ("GBL"), and propyleneglycolmonoethylether acetate (PM acetate).

In the following Examples, one of each of these has been chosen, however, it is to be recognized that many other compositions may be selected for various portions of the resist, the basis of the invention lies in the fact that the hybrid resist is comprised of a negative tone component and a positive tone component, wherein the positive tone component acts at a first actinic energy level and the negative tone component acts at a second actinic energy level, the first and second actinic energy levels being separated by an intermediate range of actinic energy levels.

EXAMPLE 1

The following compositions were dissolved in propyleneglycol monomethylether acetate (PM acetate) solvent available from Pacific Pac, Inc., Hollister, Calif. containing 350 ppm of FC-430, a non-ionic fluorinated alkyl ester surfactant available from 3M, St. Paul, Minn. for a total of 20% solids:

poly(hydroxystyrene) (PHS), 10% hydrogenated, available from Maruzen America, New York, N.Y. with about 25% of the phenol groups protected with methoxypropene (MOP), 81.2% of solids;

N-(trifluoromethylsulfonyloxy)-bicyclo-[2.2.1]-hept-5-ene-2,3- dicarboximide (MDT), available from Daychem Labs, Centerville, Ohio, 10.5% of solids;

tetramethoxymethyl glycouril (Powderlink), available from Cytec, Danbury, CTonn. 8.2% of solids; and 7-diethylamino-4-methyl coumarin dye (Coumarin 1), available from the Aldrich Chemical Company, 0.1% of solids.

Figure 9:
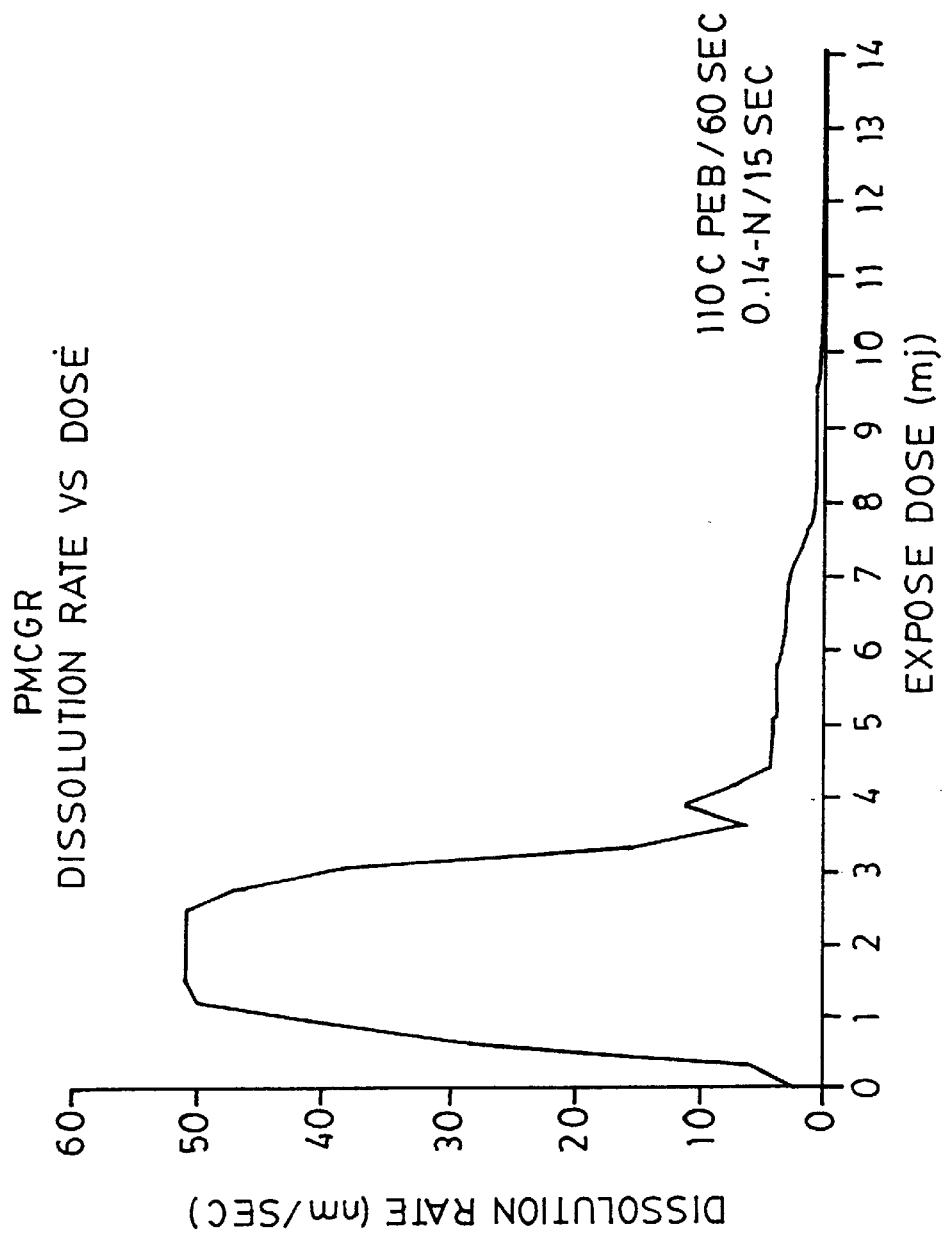
FIG. 9 is a graph showing the dissolution rate in nanometers per second (nm/sec) as a function of the exposure dose in millijoules (mJ) using one formulation of a hybrid resist of the present.

The solution was filtered through a 0.2 μm filter. The solution was coated onto silicon wafers primed with hexamethyl-disilazane with a soft bake of 110° Celsius (C.) resulting in films of about 0.8 μm thick as determined by a Nanospec reflectance spectrophotometer. The coated wafers were then exposed with deep ultraviolet (DUV) excimer laser radiation having a wavelength of 248 nm in a 0.37 numerical aperture (NA) Canon stepper with a matrix of different doses from low doses to high doses and post expose baked (PEB) at 110° C. for 90 sec. The dissolution rates of the exposed films were calculated from the thickness of remaining film after developing for a given amount of time with 0.14 Normal (N) tetramethylammonium hydroxide (TMAH) developer. The dissolution rate vs. exposure dose relationship is shown in FIG. 9. As shown in FIG. 9, the resist has a very low dissolution rate (about 2 nm/sec) when unexposed. As the dose is increased, the dissolution rate increases until reaching about 50 nm/sec. The dissolution rate remains relatively constant at this level in the dose range of about 1 millijoule (mJ) to about 3 mJ. Increasing the dose further, the negative cross-linking chemistry becomes predominant and the dissolution rate falls back to a value close to zero.

Figure 10:
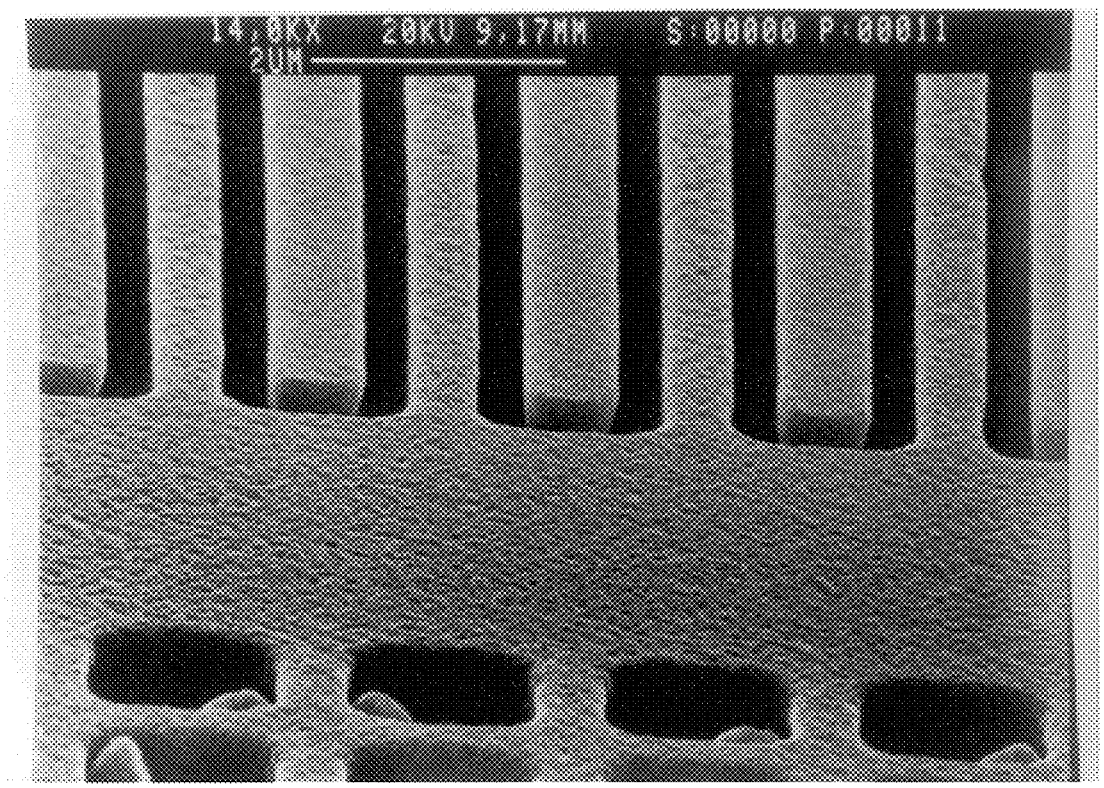
FIG. 10 is a scanning electron micrograph of the lines and spaces formed using one formulation of a hybrid resist of the present invention.

A typical lithographic response of this resist is illustrated in FIG. 10, which shows the outcome of exposing the resist through a mask having 1 μm wide nested chrome lines at a pitch of 2 μm with a 248 DUV stepper with a 0.37 NA. Every chrome line and space combination in the mask prints as two lines and two spaces on the resist: a negative line of about 0.8 μm, a positive tone line of about 0.6 μm and two equal spaces of about 0.3 μm.

Figure 11:
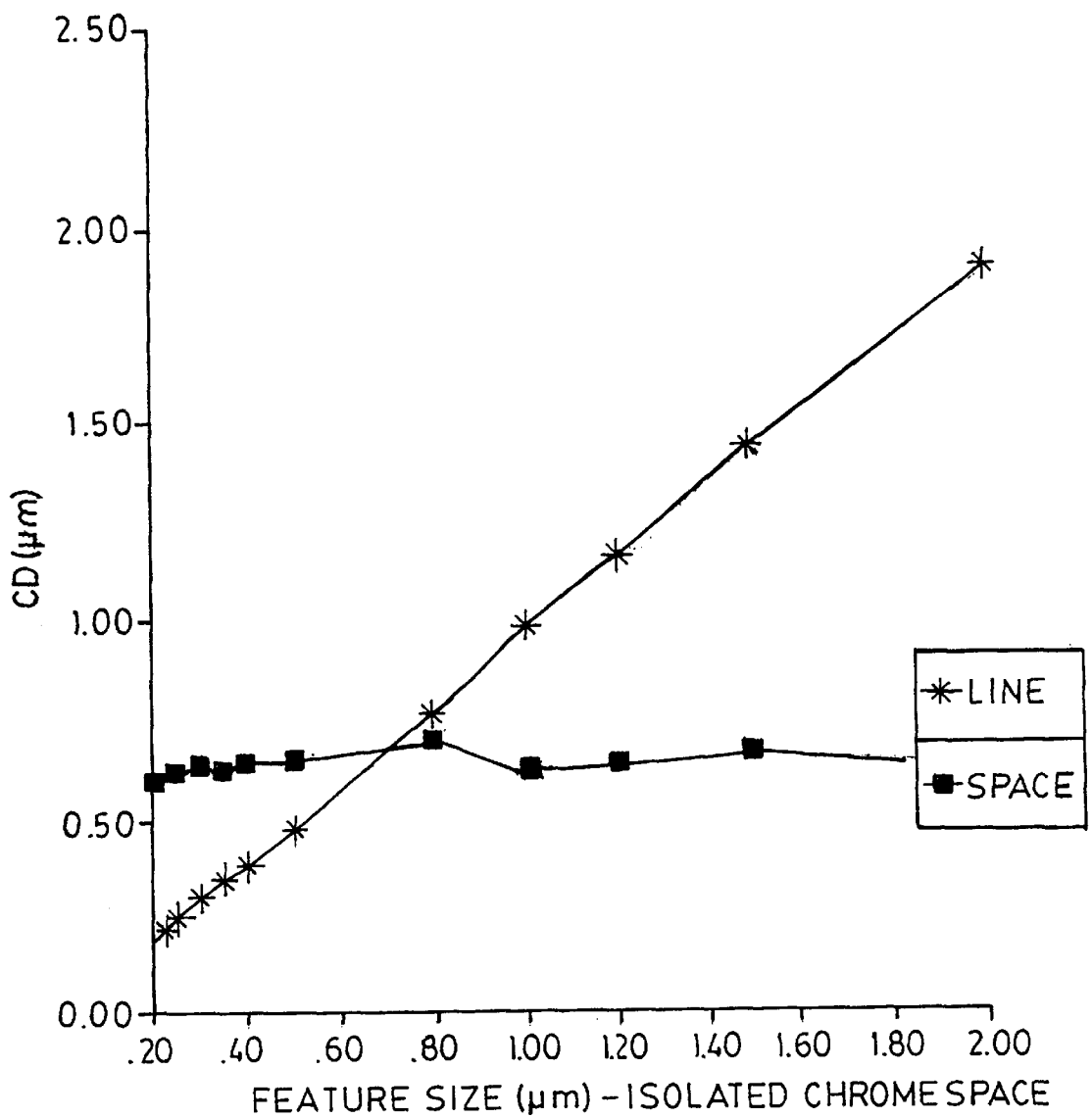
FIG. 11 is a graph showing the resultant line and space widths as functions of the chrome space width using one formulation of a hybrid resist of the present invention.

In another experiment with the same resist, when a MICRASCAN II 0.5 NA DUV stepper is used to expose an isolated chrome space onto the hybrid resist film, the space/line/space measurements as a function of width of the chrome space are plotted, as shown in FIG. 11. The data suggests that, although the width of the line increases correspondingly with that of the chrome space on the mask, the space on either side of the line remains relatively constant.

EXAMPLE 2

This example illustrates the manner in which changing the type of photoacid generator and relative amounts of the various components can change the dissolution rate characteristics of the hybrid resist and subsequently the lithographic response. This second formulation was prepared and processed in a manner similar to EXAMPLE 1, however, it is comprised of the following components:

PHS with about 25% of the phenol groups protected with MOP, 90.8% of solids;

triphenyl sulfonium triflate, 1.3% of solids;

Powderlink, 7.8% of solids;

tetrabutyl ammonium hydroxide base, 0.1% of solids; and sufficient PM acetate containing 350 ppm FC-430 surfactant as a solvent to form a 18.9% solids solution.

Figure 12:
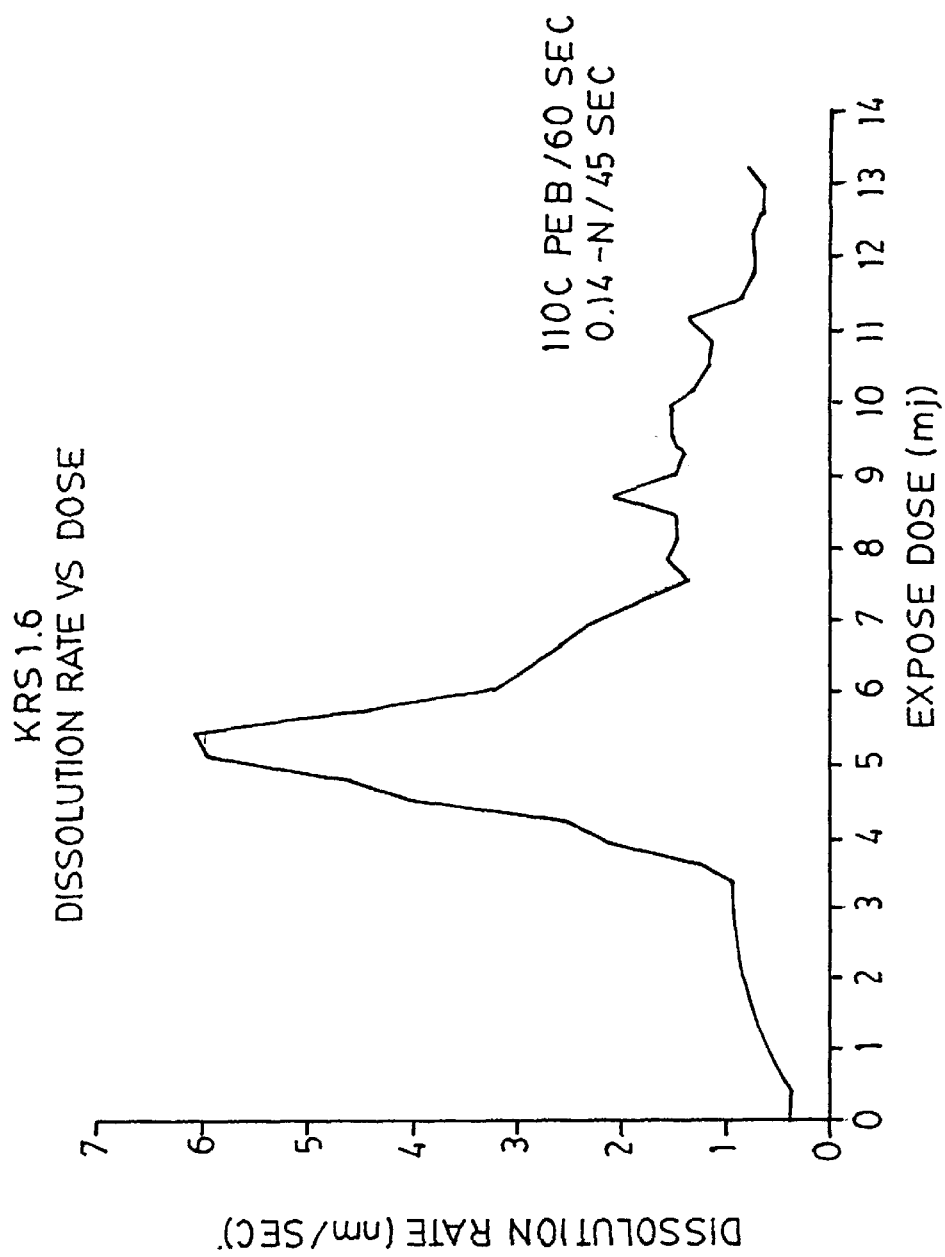
FIG. 12 is a graph showing the dissolution rate of an alternative formulation of the hybrid resist in nm/sec as a function of the exposure dose in mJ.

The dissolution rate characteristic of the resulting hybrid resist is shown in FIG. 12. The overall nature of the curve remains similar to that shown by the hybrid resist of EXAMPLE 1, in that the dissolution rate starts out low for an unexposed resist, increases to a high at about 5 mJ and decreases to a low above 7 mJ. However, the absolute dose range and the dissolution rates within these ranges are quite different from those shown in FIG. 9.

Figure 14:
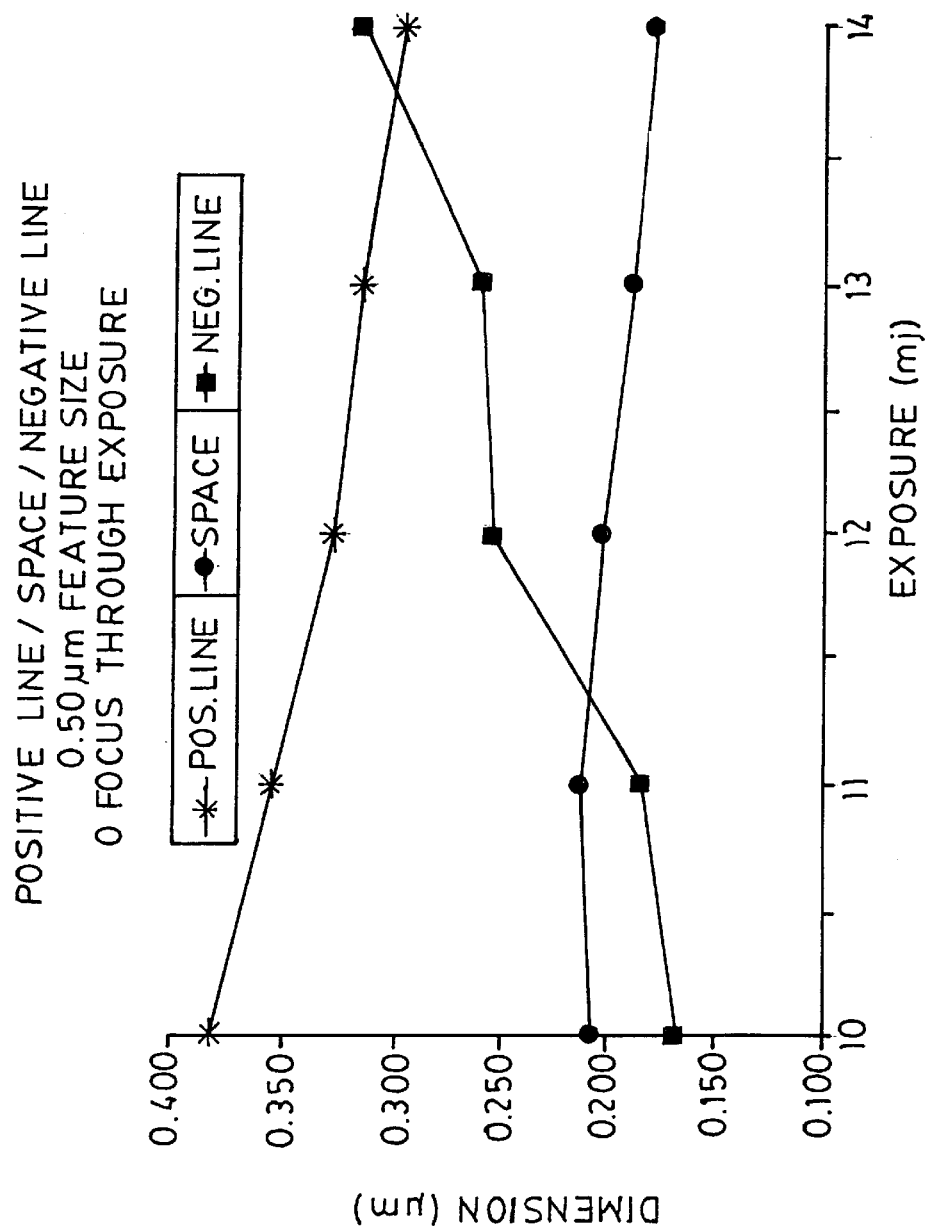
FIG. 14 is a graph of the response of a formulation of the hybrid resist of the present invention in which exposed (negative) line, unexposed (positive) line and space widths are plotted as a function of exposure dose.
Figure 15:
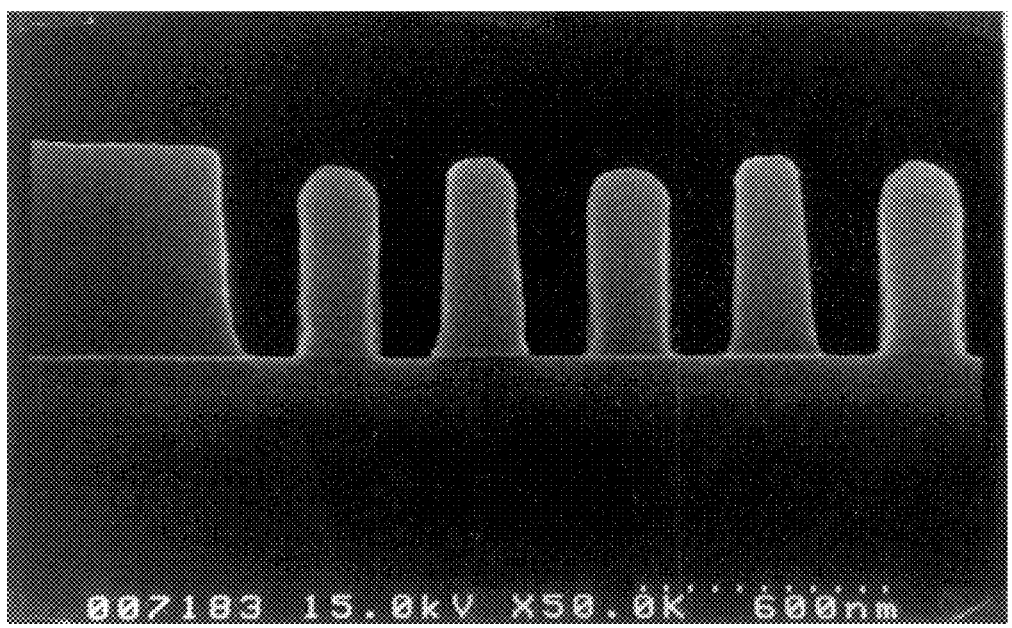
FIG. 15 is a scanning electron micrograph of 0.18 $\mu$m resist lines and spaces printed on a 0.5 numerical aperture (NA) deep ultra violet (DUV) expose tool with a hybrid resist formulation as described in Example 2 of the present invention.

FIG. 14 represents the response of this formulation of the hybrid resist when exposed through a mask of nested chrome lines and spaces of equal widths in a MICRASCAN II DUV 0.5 NA stepper tool. Negative line, unexposed (positive) line and space widths are plotted as a function of mask dimension. The space remains relatively constant in the range of about 0.18 µm, whereas both lines vary as the mask dimension is varied. Resist images representative of this formulation and process are shown in FIG. 15.

EXAMPLE 3

This example illustrates that the space width of the frequency doubled image can be changed by varying the protection level of PHS with MOP. Two different PHS lots having 24% and 15% MOP loading, respectively, were used to make hybrid formulations identical to that of EXAMPLE 1, except that the total solids contents were adjusted to 16.0% of the total to obtain film thicknesses of about 0.5 µm. From these two stock formulations, several other formulations with average MOP levels ranging from 15 to 24% were prepared. Wafers were coated and soft baked at 110° C., exposed on a MICRASCAN II DUV 0.5 NA stepper, post exposed baked at 110° C. for 60 sec and finally developed with 0.14N TMAH developer. A reticle with an-isolated chrome opening was printed in a hybrid resist film. The spacewidth of the resist image was measured and graphed as a function of the average MOP solubility inhibitor loading in the PHS used for making the respective formulations. It was found that the space width was strongly AS dependent on MOP concentration, as shown in FIG. 13.

EXAMPLE 4

Negative tone imaging may be performed with the hybrid resist of the present invention, using a blanket DUV expose after the PEB and prior to the develop.

A hybrid resist formulation as described in EXAMPLE 2, above, was image-wise exposed with a chrome reticle with an electrical test pattern on a 0.5 NA DUV expose system. Silicon wafers (200 mm) with a 2000 Angstrom (Å) film of polysilicon were used as a substrate so that the resulting etched patterns of the resist image could be measured with electrical probe techniques. After the post expose bake process, the wafers were cycled back into the expose tool (MICRASCAN II) and exposed at 10 mJ per square centimeter ($cm^2$) with a clear glass reticle. A post expose bake process was not performed after the second exposure. The purpose of the second exposure was to remove the initially unexposed resist from the wafer, leaving only a negative tone resist pattern after develop.

The initial image-wise expose dose was 17–24 mJ/cm2, the post expose bake temperature was 110° C. for 90 sec and the develop time was 100 sec in 0.14N TMAH. A standard negative tone resist was processed in a similar fashion, with the omission of a blanket expose step as a control. The electrical data from this experiment is shown in FIGS. 2 and 3. A large isofocal print bias of approximately 0.11 µm was observed for the hybrid resist relative to the standard negative resist, as calculated using standard methods known in the art.

While the invention has been particularly shown and described with reference to preferred exemplary embodiments thereof, it will be understood by those skilled in the art that the foregoing and other changes in form and details may be made therein without departing from the spirit and scope of the invention.

Accordingly, what is claimed is:

1. A method of producing an integrated circuit chip comprising:
  selecting a photoresist composition comprising a negative tone component and an positive tone component, wherein the positive tone component acts at a first actinic energy level and wherein the negative tone component acts at a second actinic energy level, said first and second actinic energy levels being separated by an intermediate range of actinic energy levels;
  depositing a layer of the selected photoresist material onto a surface, thereby forming a film;
  exposing a portion of the film through an opening a mask to the first actinic energy level, the range of intermediate energy levels, and the second energy level; and
  forming a pattern in the film by developing the film, wherein the pattern comprises a photoresist region sandwiched between a first space and a second space, and wherein the photoresist region, less than a full portion of the first space, and less than a full portion of the second space are each aligned under the opening.

2. The method of claim 1, further comprising the step of baking the film after exposing and before developing the film.

3. The method of claim 2, further comprising the step of blanket exposing the film to a low dose of actinic energy after the exposure step and before the baking step.

4. The method of claim 2, further comprising the step of blanket exposing the film after the baking step and before the developing step.

5. The method of claim 2, further comprising the step of image-wise re-exposing the film after the baking step and before the developing step.

6. The method of claim 1, further comprising selecting a reticle having a frequency of lines and spaces, wherein the frequency of the lines and spaces is doubled.

7. The method of claim 1, further comprising the step of selecting the positive tone component and the negative tone component so that the first actinic energy level is lower than the second actinic energy level.

8. The method of claim 1, further comprising the step of selecting the positive tone component and the negative tone component so that the second actinic energy level is lower than the first actinic energy level.

9. The method of claim 1, further comprising the step of selecting the positive tone component to be less sensitive than the negative tone component to post expose bake conditions.

10. The method of claim 1, wherein the photoresist composition further comprises a solubility inhibitor at a predetermined concentration, further comprising the step of selecting the concentration of the solubility inhibitor to obtain a desired spacewidth.

11. The method of claim 1, further comprising a step of utilizing a gray-scale filter during the exposure step, thereby creating areas of intermediate exposure.

12. The method of claim 1, wherein changes of the exposure dose have no effect on the size of the photoresist region, the first space and the second space.

13. The method of claim 1, further comprising selecting a reticle having lines and spaces, wherein both the lines and the spaces have lengths and widths, for use in said exposing the portion of the film, wherein variations in the widths of the lines and spaces of the reticle have no effect on the widths of the photoresist region.

* * * * *